(12) United States Patent
Yang et al.

(10) Patent No.: US 7,304,508 B1
(45) Date of Patent: Dec. 4, 2007

(54) METHOD AND APPARATUS FOR FAST FLIP-FLOP

(76) Inventors: Ge Yang, 1700 Halford Ave., Apt. 221, Santa Clara, CA (US) 95051; Hank Lin, 2101 Edgewood Dr., Palo Alto, CA (US) 94303; Charles Young, 20875 Greenleaf Dr., Cupertino, CA (US) 95024

( * ) Notice: Subject to any disclaimer, the term of this patent is extended or adjusted under 35 U.S.C. 154(b) by 148 days.

(21) Appl. No.: 11/175,552

(22) Filed: Jul. 5, 2005

(51) Int. Cl.
*H03K 19/096* (2006.01)

(52) U.S. Cl. .................. 326/98; 326/95; 326/119; 326/104

(58) Field of Classification Search ............... 326/119, 326/95, 98
See application file for complete search history.

(56) References Cited

U.S. PATENT DOCUMENTS

| | | | |
|---|---|---|---|
| 6,023,179 A * | 2/2000 | Klass | 327/211 |
| 6,201,415 B1 * | 3/2001 | Manglore | 326/98 |
| 6,388,471 B1 * | 5/2002 | Lu et al. | 326/98 |
| 6,693,459 B2 * | 2/2004 | Nedovic et al. | 326/93 |
| 7,027,345 B2 * | 4/2006 | Nedovic et al. | 365/226 |

* cited by examiner

*Primary Examiner*—Vibol Tan
*Assistant Examiner*—Crystal L Hammond
(74) *Attorney, Agent, or Firm*—Berkeley Law and Technology Group, LLP

(57) ABSTRACT

Embodiments related to fast flip-flops are disclosed.

26 Claims, 6 Drawing Sheets

US 7,304,508 B1

METHOD AND APPARATUS FOR FAST FLIP-FLOP

FIELD

This application pertains to the field of electronic circuits, and more particularly, to the field of flip-flops.

BACKGROUND

In order to improve the performance of a wide range of electronic devices, including, for example, computer systems, game consoles, cellular phones, personal digital assistants, etc., electronic circuit designers seek ways to speed up the operation of circuits within the electronic devices. One type of circuit commonly found in electronic devices are flip-flops. Flip-flops are sequential logic circuits, and typically have two stable output states. One output state may be maintained until a change in a data input value prompts a change in output state. The performance of flip-flop circuits may be limited by the amount of time it takes for the flip-flop circuitry to recognize and respond to a change in the data input value.

BRIEF DESCRIPTION OF THE DRAWINGS

The claimed subject matter will be understood more fully from the detailed description given below and from the accompanying drawings of embodiments which should not be taken to limit the claimed subject matter to the specific embodiments described, but are for explanation and understanding only.

DETAILED DESCRIPTION

Figure 1:
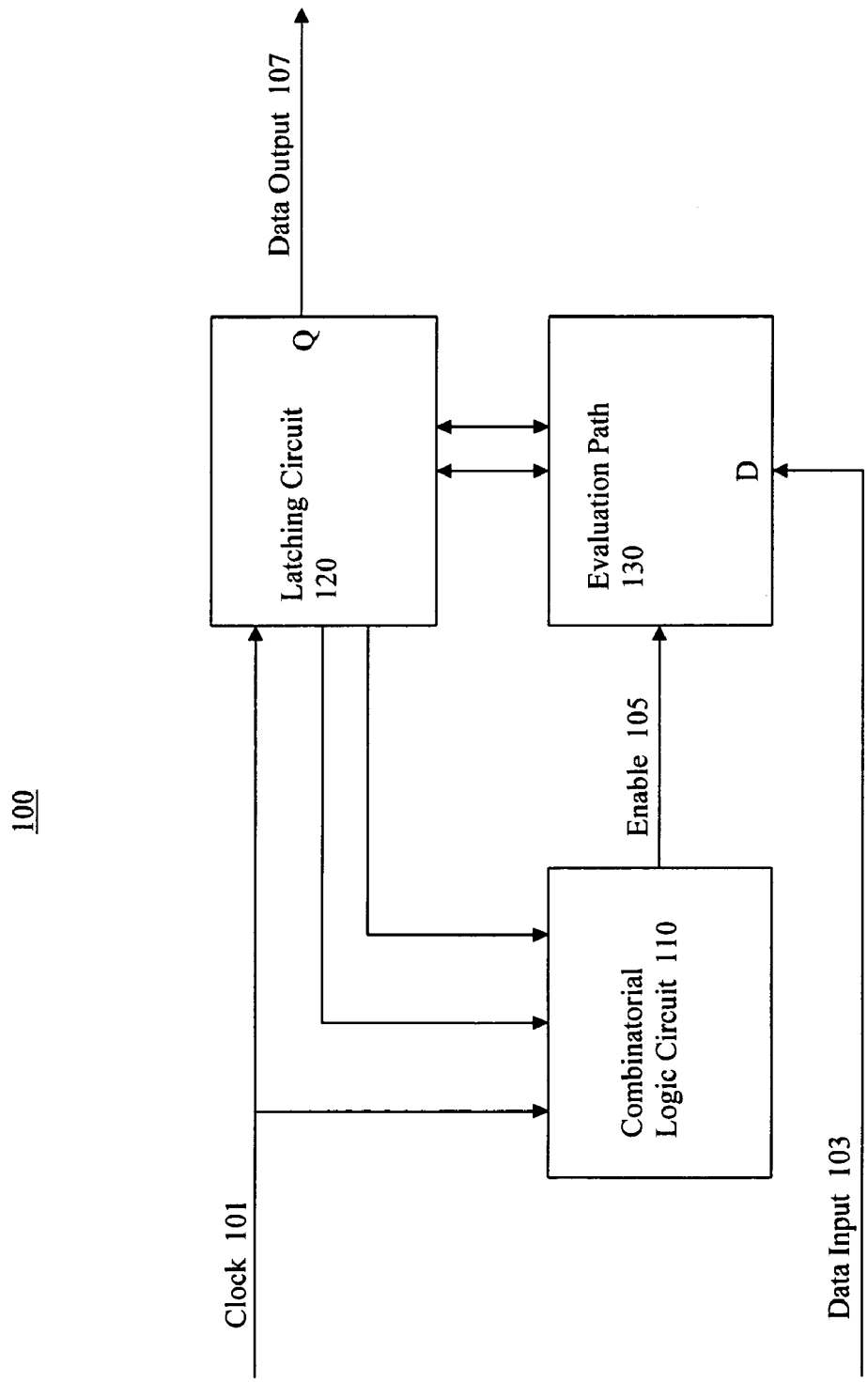
FIG. 1 is a block diagram of one embodiment of an example flip-flop.

FIG. 1 is a block diagram of one embodiment of an example flip-flop 100. Flop 100 includes a latching circuit 120, an evaluation path circuit 130, and a combinatorial logic circuit 110. A clock signal 101 is received at latching circuit 120 and at combinatorial logic circuit 110. A data input signal 103 is received at evaluation path circuit 130. A data output signal 107 is coupled to latching circuit 120.

For this example embodiment, the operation of flop 100 may be divided into a precharge period and an evaluation period. The precharge period may occur when clock signal 101 is at a logically low voltage level (logical value '0') and the evaluation period may occur when clock signal 101 is at a logically high voltage level (logical value '1'). During the precharge period, two signals generated at latching circuit 120 may be driven to a logically high voltage level. For this example embodiment, combinatorial logic circuit 110 may perform an "AND" function, with an enable signal 105 becoming asserted when each of the signals from latching circuit 120 are asserted and the clock signal is at '1'.

An evaluation phase begins with a transition of clock signal 101 from '0' to '1'. An assertion of enable signal 105 causes evaluation path circuit 130 to communicate to latching circuit 120 the state of data input signal 103. Latching circuit 120 drives an appropriate value (depending on the state of data input signal 103) onto data output signal 107. Latching circuit 120 maintains this value on data output 107 until some future evaluation period where a change in the state of data input signal 103 is noted.

For this example embodiment, once evaluation path circuit 130 communicates the state of data input signal 103, one of the signals coupled between combinatorial logic circuit 110 and latching circuit 120 becomes deasserted, and as a result enable signal 105 becomes deasserted. By deasserting enable signal 105, evaluation path circuit 130 is no longer enabled, and the state of data input signal 103 can change without affecting evaluation path circuit 130 and therefore without affecting latching circuit 120. In this manner, combinatorial logic circuit 110 provides a data isolation function.

During a subsequent precharge phase, both signals coupled between combinatorial logic circuit 110 and latching circuit 120 return to an asserted state. Clock signal 101 has a value of '0', so enable signal 105 is not asserted. Because enable signal 105 is not asserted, the state of data input 103 can change without affecting latching circuit 120 or evaluation path circuit 130.

Although example flop 100 is described having one configuration of signals and/or circuits and/or functions, other embodiments are possible using other configurations of signals and/or circuits and/or functions.

Figure 2:
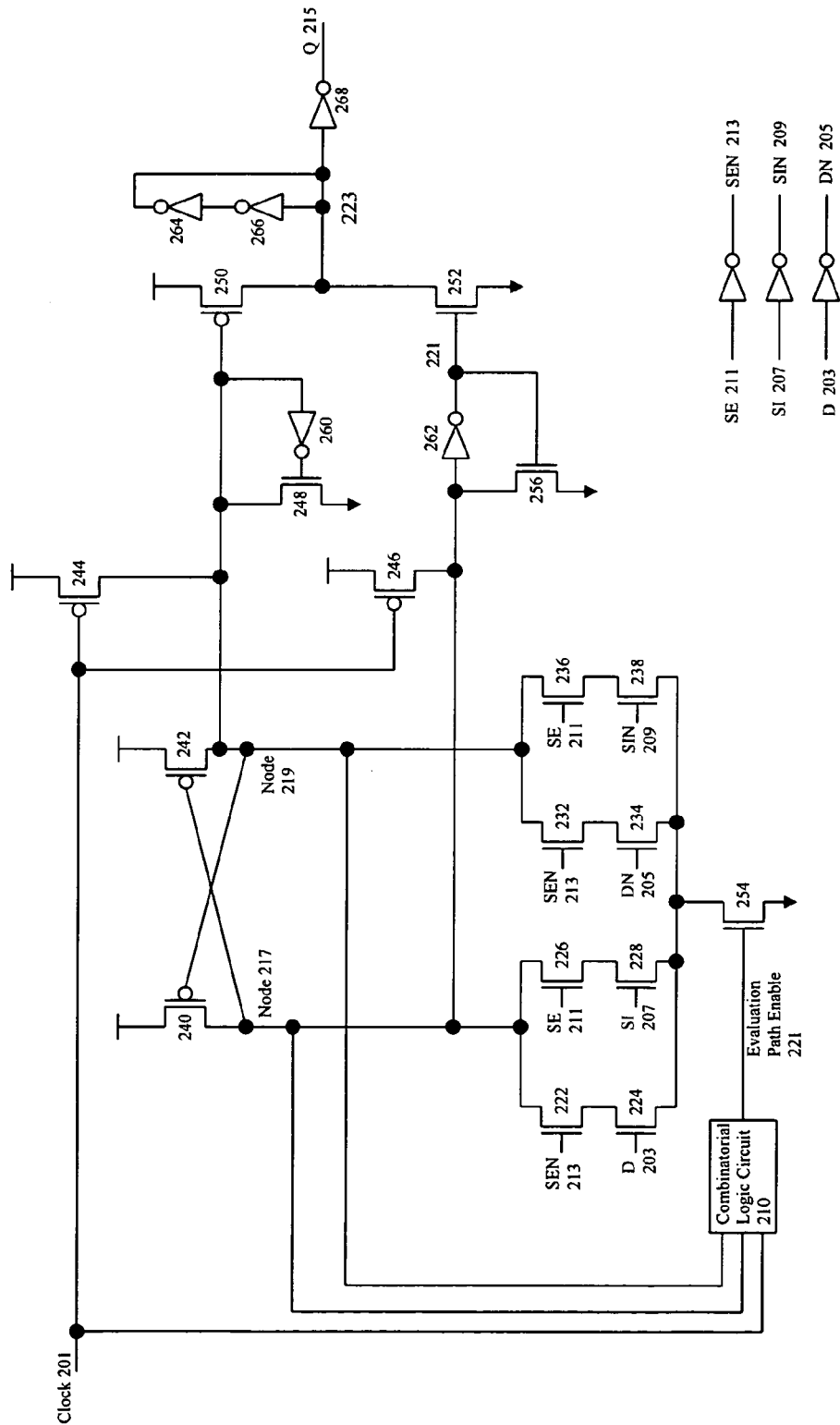
FIG. 2 is a schematic diagram of one embodiment of an example flip-flop.

FIG. 2 is a schematic diagram of one embodiment of an example flip-flop 200. Flop 200 includes a combinatorial logic circuit 210, which for this example implements an AND function. NMOS transistors 222, 224, 226, 228, 232, 234, 236, 238, and 254 comprise an evaluation path circuit. The remainder of the transistors and invertors comprise for this example a latching circuit. Flop 200 receives as inputs a data input signal (D) 203, an inverted data input signal (DN) 205, a scan enable (SE) signal 211, an inverted scan enable signal (SEN) 213, a scan data input (SI) signal 207, an inverted scan data input (SIN) signal 209, and a clock signal 201. Flop 200 provides an output signal Q 215.

Signals SE 211, SEN 213, SI 207, and SIN 209 may be used in connection with scan test operations, although these operations are not discussed further herein. For the data latching operations that are discussed herein, SE 211 has a value of '0' and SEN 213 has a value of '1'. The values of SI 207 and SIN 209 have no effect for the data latching operations discussed herein.

For this example embodiment, the operation of flop 200 may be divided into a precharge period and an evaluation period. The precharge period may occur when clock signal 201 is at a logically low voltage level (logical value '0') and the evaluation period may occur when clock signal 101 is at a logically high voltage level (logical value '1').

During a precharge period, clock 201 is at '0', thereby enabling a PMOS transistor 244 and a PMOS transistor 246. Also because clock 201 is at '0', combinatorial logic circuit 210 does not assert an evaluation path enable signal 221, so no current is able to flow through the evaluation path. The enabling of transistors 244 and 246 causes a node 217 and a node 219 to be pulled to a logically high voltage level (logical value '1'). Because nodes 217 and 219 are at '1', transistors 250 and 252 are not enabled. Inverters 264 and 266 keep node 223 at its previous value.

When clock signal 201 transitions from '0' to '1', the evaluation phase begins. With clock 201 at '1', transistors 244 and 246 are no longer enabled. With node 217, node 219, and clock signal 201 all at '1', evaluation path enable signal 221 is asserted (logical value '1'). The assertion of evaluation path enable signal 221 enables transistor 254, and current may now flow through the evaluation path depending on the values present on the various inputs. For this example, assume that D 203 has a value of '1', and SE 211 has a value of '0'. Because SE 211 has a value of '0', no current will flow through transistors 226 and 236. Because D 203 has a value of '1', no current will flow through transistor 234, but current will flow through transistors 222 and 224. The enabling of transistors 254, 222, and 224 causes node 217 to be pulled to a logically low voltage level ('0'). With node 217 at '0', transistor 242 is enabled to keep node 219 at '1', inverter 262 causes node 221 to go to '1', and NMOS transistors 256 and 252 become enabled. Transistor 256 keeps node 217 at '0', and transistor 252 pulls node 223 to a logically low voltage level ('0'). Inverter 268 drives a value of '1' onto Q 215.

When node 217 goes to '0', evaluation path enable signal 221 is deasserted and transistor 254 is no longer enabled. Because transistor 254 is no longer enabled, no current can flow through it, so the various values of inputs D 203, SE 211, and SI 207 can change without affecting nodes 217 or 219. In this manner, combinatorial logic circuit 210 provides a data isolation function.

To begin a new precharge period, clock 201 transitions from '1' to '0', thereby enabling transistors 244 and 246. Also because clock 201 is at '0', combinatorial logic circuit 210 does not assert an evaluation path enable signal 221, so no current is able to flow through any of the transistors that comprise the evaluation path. The enabling of transistors 244 and 246 causes nodes 217 and 219 to be pulled to a logically high voltage level (logical value '1'). Because nodes 217 and 219 are at '1', transistors 250 and 252 are not enabled. Inverters 264 and 266 keep node 223 at its previous value, which in this case is '0'.

A new evaluation phase begins when clock signal 201 transitions from '0' to '1'. With clock 201 at '1', transistors 244 and 246 are no longer enabled. With node 217, node 219, and clock signal 210 all at '1', evaluation path enable signal 221 is asserted (logical value '1'). The assertion of evaluation path enable signal 254 enables transistor 254, and current may now flow through the evaluation path depending on the values present on the various inputs. For this example, assume that D 203 has transitioned to a value of '0'. SE 211 continues to have a value of '0' for this example. Because D 203 has a value of '0', no current will flow through transistor 224, but current will flow through transistors 232 and 234. The enabling of transistors 254, 232, and 234 causes node 219 to be pulled to a logically low voltage level ('0'). With node 219 at '0', transistor 240 is enabled to keep node 217 at '1', and inverter 260 causes NMOS transistor 248 to become enabled. PMOS transistor 250 is also enabled. Transistor 248 keeps node 219 at '0', and transistor 250 pulls node 223 to a logically high voltage level ('1'). Inverter 268 drives a value of '0' onto Q 215.

When node 219 goes to '0', evaluation path enable signal 221 is deasserted and transistor 254 is no longer enabled. Because transistor 254 is no longer enabled, no current can flow through it, so the various values of inputs D 203, SE 211, and SI 207 can change without affecting nodes 217 or 219.

For this example embodiment that includes scan test functionality, an evaluation path for any given evaluation period includes three transistors. For example, when D='1' and SE='0', the evaluation path includes transistors 222, 224, and 254. The use of a combinatorial logic circuit to enable the evaluation path circuitry allows the use of fewer transistors in the evaluation path than would otherwise be possible. For embodiments that do not include scan test capabilities, only two transistors would be included in the evaluation path for any given evaluation period. Using fewer transistors in the evaluation path may result in faster flip-flop operation.

Figure 3:
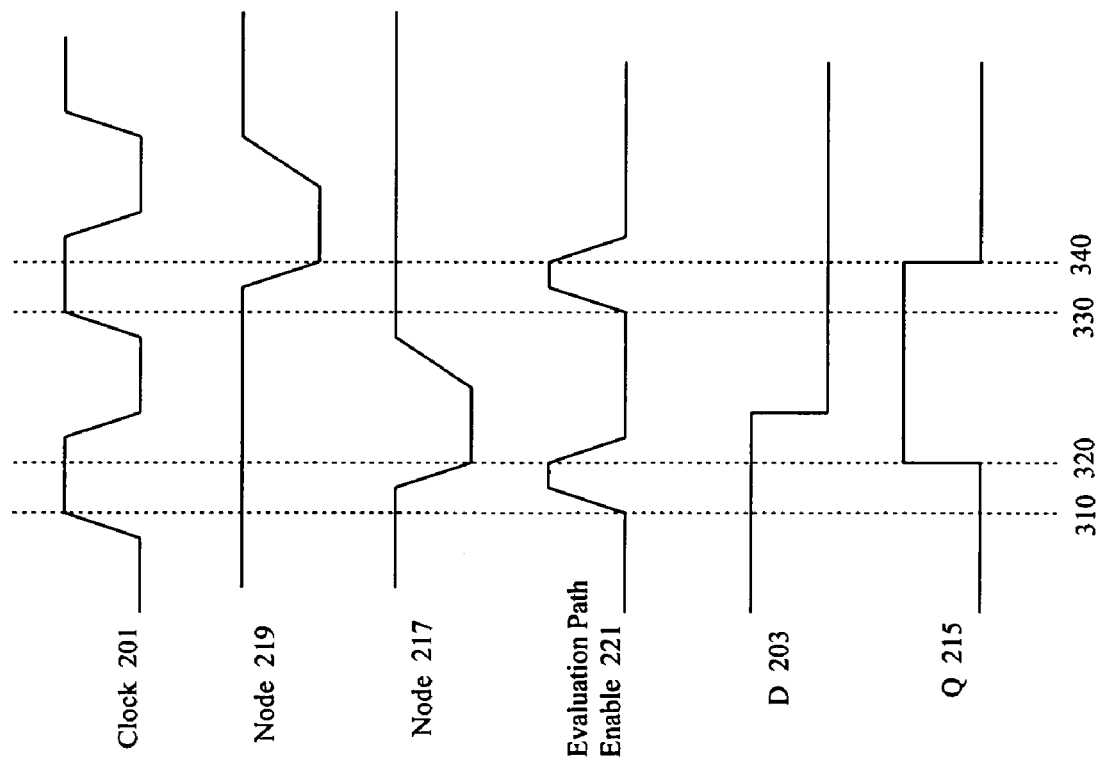
FIG. 3 is a timing diagram depicting an example operation of the flip-flop of FIG. 2.

FIG. 3 is a timing diagram depicting an example operation of example flip-flop 200. Clock signal 201 begins with a value of '0'. For this example, a value of '0' on clock 201 indicates a precharge period. During this initial precharge period, nodes 217 and 219 have a value of '1'. Because clock 201 is at '0', evaluation path enable signal 221 is not asserted. For this example, D 203 begins with a value of '1' and output signal Q 215 has a value of '0'.

At time 310, clock 201 transitions to a value of '1', indicating the beginning of an evaluation phase. In response to clock 201 going to a value of '1', evaluation path enable signal 221 becomes enabled. Because D 203 has a value of '1', node 217 is pulled to a value of '0'.

At time 320, because node 217 has been pulled to a value of '0', output signal Q 215 transitions to a value of '1'. Also because node 217 is at '0', evaluation path enable signal 221 begins to transition to '0'. Shortly after time 320, clock 201 returns to a value of '0', indicating a new precharge period. During this precharge period, node 217 returns to a value of '1'. At some point during this precharge period, D 203 for this example changes to a value of '0'.

At time 330, clock 201 transitions to a value of '1', indicating the beginning of a new evaluation phase. In response to clock 201 going to a value of '1', evaluation path enable signal 221 becomes enabled. Because D 203 has a value of '0', node 219 is pulled to a value of '0'. At time 340, because node 219 has been pulled to a value of '0', output signal Q 215 transitions to a value of '0'. Also because node 219 is at '0', evaluation path enable signal 221 begins to transition to '0'.

Although the timing diagram of FIG. 3 shows particular relationships among the various signals, other embodiments are possible using other timing relationships among the various signals. Further, the timing diagram of FIG. 3 is meant merely as an illustration, is not drawn to scale, and is not meant to denote specific timings for the various signals.

Figure 4:
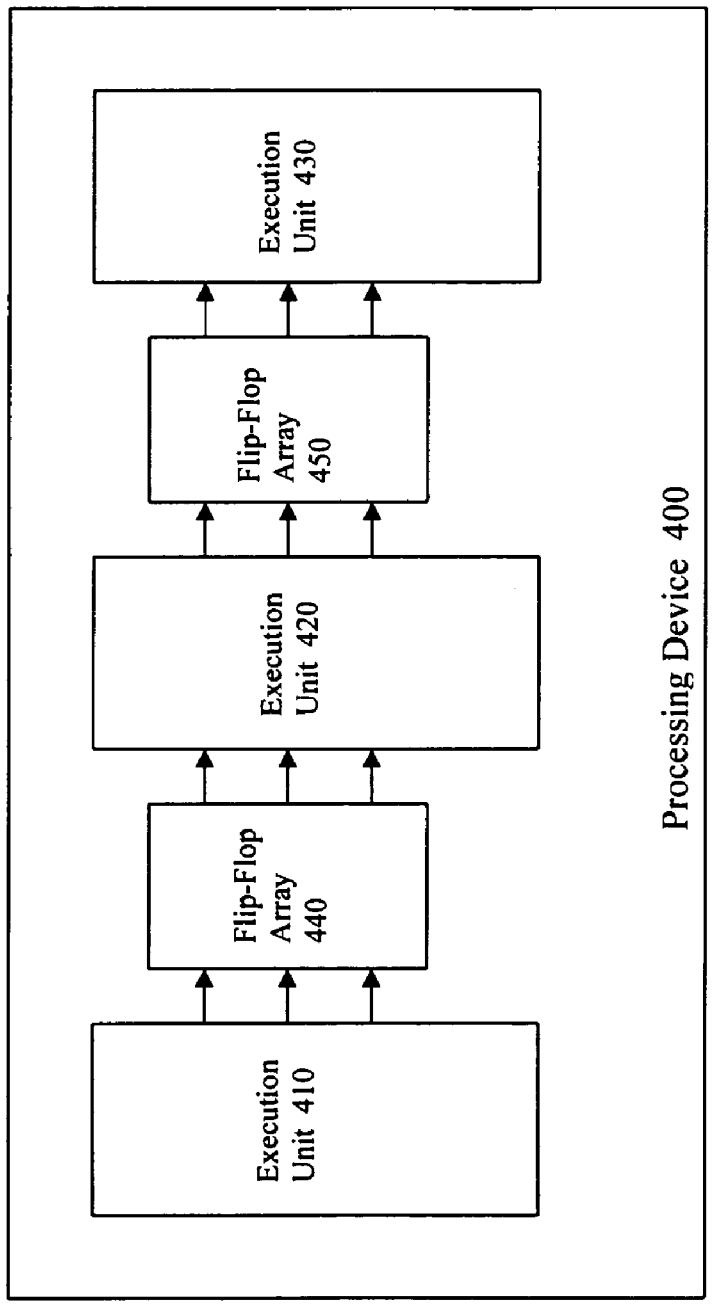
FIG. 4 is a block diagram of an example processing device including an array of example flip-flops.

FIG. 4 is a block diagram of an example processing device 400 including example arrays of flip-flops 440 and 450. Flip-flop array 440 is situated between execution unit 410 and execution unit 420. Flip-flop array 450 is situated between execution unit 420 and execution unit 430. For this example, execution units 410, 420, and 430 may comprise stages of an execution pipeline. Processing device 400 may comprise any of a number of processing device types, including, but not limited to, central processing units, graphics processing units, etc. For this example embodiment, processing device 400 comprises a graphics processing unit.

Flip-flop arrays 440 and 450 may include a plurality of flip-flops such as those discussed above in connection with FIGS. 1 through 3. Array 440 may receive multiple data input signals from execution unit 410, and may output multiple data signals to execution unit 420. Similarly, array 450 may receive multiple data input signals from execution unit 420, and may output multiple data signals to execution unit 430.

Although FIG. 4 depicts arrays of flip-flops being used to couple execution units within a processing device, the flip-flop embodiments discussed herein may be used in any of a wide range of electronic devices, and may be used to help perform any of a wide range of functions.

Figure 5:
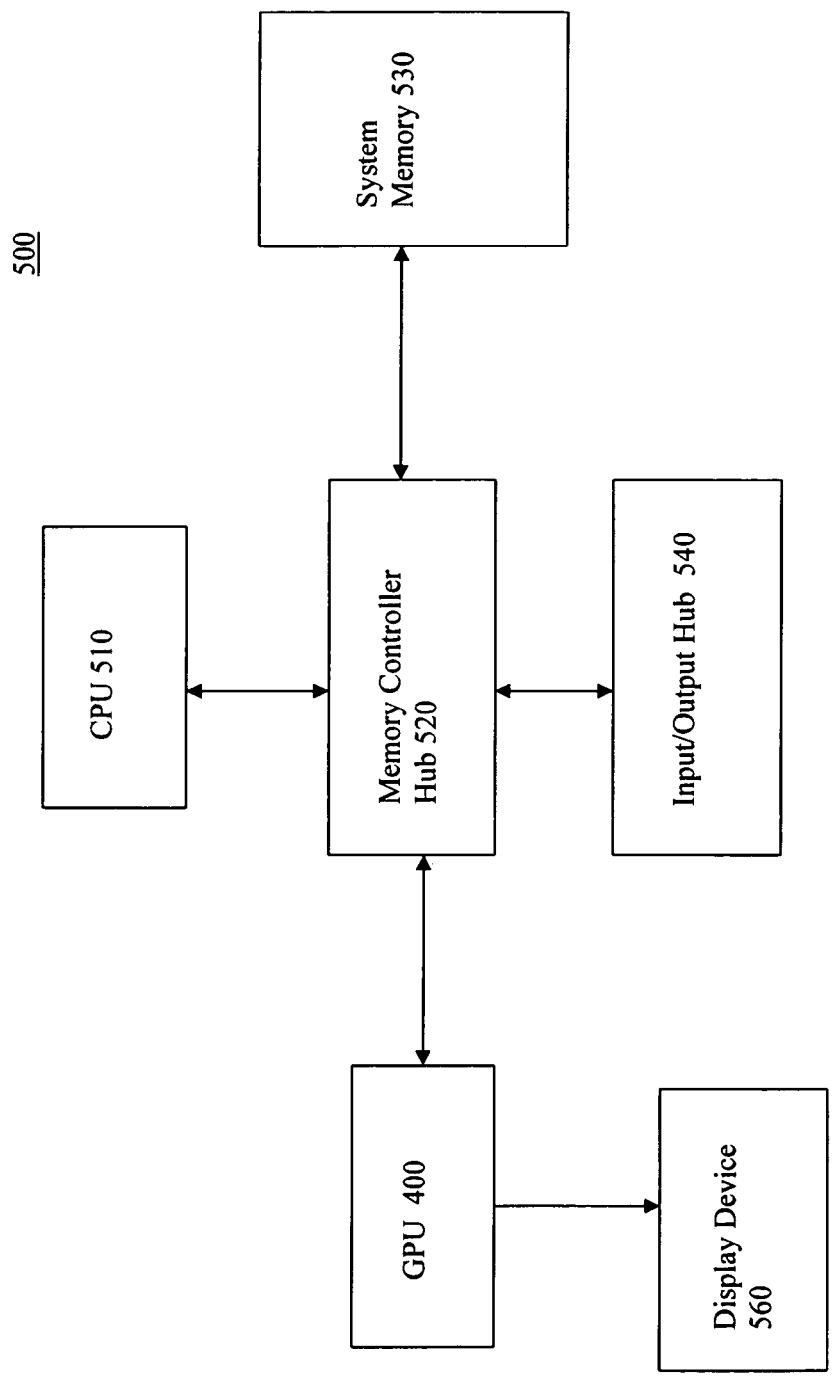
FIG. 5 is a block diagram of an example computer system.

FIG. 5 is a block diagram of an example computer system 500. System 500 includes a central processing unit (CPU) 510 and a memory controller hub 520 coupled to CPU 510. Memory controller hub 520 is further coupled to a system memory 530, to a graphics processing unit (GPU) 400, and to an input/output hub 540. GPU 400 is further coupled to a display device 560, which may comprise a CRT display, a flat panel LCD display, or other type of display device.

GPU 400 may comprise a processing device similar to that discussed above in connection with FIG. 4, where the processing device includes arrays of flip-flops, where the flip-flops are implemented in a manner consistent with the embodiments discussed above in connection with FIGS. 1 through 3.

Embodiments of flip-flops such as those discussed above in connection with FIGS. 1 through 3 may be included an many of the components of system 500, including CPU 510, memory controller hub 520, input/output hub 540, and system memory 530. The flip-flops may also be included in some types of display devices.

Although example system 500 is shown with a particular configuration of components, other embodiments are possible using any of a wide range of configurations. Further, although the use of flip-flops in computer systems is discussed herein, the example embodiments of flip-flops discussed herein may be used in a wide range of electronic devices, including, but not limited to, computer systems, gaming devices, cellular phones, personal digital assistants, music players, communications network components, etc.

Figure 6:
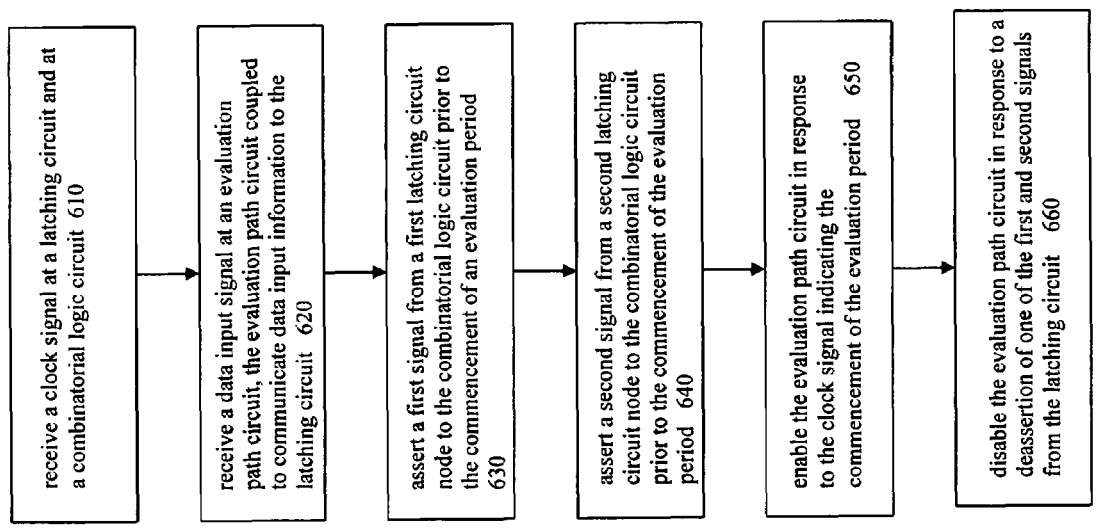
FIG. 6 is a flow diagram of one embodiment of a method for latching data.

FIG. 6 is a flow diagram of one embodiment of a method for latching data. At block 610, a clock signal is received at a latching circuit and at a combinatorial logic circuit. At block 620, a data input signal is received at an evaluation path circuit. The evaluation path circuit may be coupled to communicate data input information to the latching circuit. At block 630, a first signal is asserted from a first latching circuit node to the combinatorial logic circuit prior to the commencement of an evaluation period. At block 640, a second signal is asserted from a second latching circuit node to the combinatorial logic circuit prior to the commencement of the evaluation period, and at block 650, the evaluation path circuit is enabled in response to the clock signal indicating the commencement of the evaluation period. At block 660, the evaluation path circuit is disabled in response to a deassertion of one of the first and second signals from the latching circuit.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments.

In the foregoing specification claimed subject matter has been described with reference to specific example embodiments thereof. It will, however, be evident that various modifications and/or changes may be made thereto without departing from the broader spirit and/or scope of the subject matter as set forth in the appended claims. The specification and/or drawings are, accordingly, to be regarded in an illustrative rather than in a restrictive sense.

What is claimed is:

1. An apparatus, comprising:
   a latching circuit;
   an evaluation path circuit coupled to the latching circuit; and
   a combinatorial logic circuit adapted to receive a first signal from a first node of the latching circuit and a second signal from a second node of the latching circuit, wherein the combinatorial logic circuit is coupled to the evaluation path circuit, the combinatorial logic circuit to enable the evaluation path circuit during at least a portion of an evaluation phase at least in part in response to the first and second signals from the latching circuit.

2. The apparatus of claim 1, wherein the evaluation path circuit is adapted to communicate data input information to the latching circuit during at least a portion of the evaluation phase.

3. The apparatus of claim 2, wherein the combinatorial logic circuit and the latching circuit are coupled to a clock signal.

4. The apparatus of claim 3, wherein the evaluation path circuit is adapted to receive a data input signal.

5. The apparatus of claim 4, wherein the latching circuit is adapted to output a data output signal.

6. The apparatus of claim 5, wherein the combinatorial logic circuit is adapted to enable the evaluation path circuit in response to an edge of the clock signal, wherein the combinatorial logic circuit is further adapted to disable the evaluation path circuit in response to a deassertion of at least one of the first and second signals from the latching circuit.

7. The apparatus of claim 6, wherein the combinatorial logic circuit is adapted to enable the evaluation path circuit by asserting an enable signal to the evaluation path circuit, the assertion of the enable signal to enable a switching device to allow current to flow through the evaluation path circuit.

8. The apparatus of claim 7, wherein the evaluation path circuit is further adapted to receive a scan enable signal and a scan input signal.

9. A method, comprising,
   receiving a clock signal at a latching circuit and at a combinatorial logic circuit;
   receiving a data input signal at an evaluation path circuit, wherein the evaluation path circuit communicates data input information to the latching circuit;
   asserting a first signal from a first node of the latching circuit to the combinatorial logic circuit prior to the commencement of an evaluation period;
   asserting a second signal from a second node of the latching circuit to the combinatorial logic circuit prior to the commencement of the evaluation period;
   enabling the evaluation path circuit in response to an edge of the clock signal; and
   disabling the evaluation path circuit at least in part in response to a deassertion of one of the first and second signals from the latching circuit.

10. The method of claim 9, further comprising communicating data input information from the evaluation path circuit to the latching circuit in response to the enabling the evaluation path circuit.

11. The method of claim 10, further comprising outputting a signal with a value corresponding to the communicated data input information.

12. The method of claim 11, wherein enabling the evaluation path circuit includes enabling a switching device to allow current to flow through at least a portion of the evaluation path circuit.

13. An apparatus, comprising:
   means for latching;
   means for evaluating a data input signal, wherein the means for evaluating are coupled to the means for latching; and
   means for enabling the means for evaluating, wherein the means for enabling comprises a combinatorial logic circuit adapted to receive a first signal from a first node of the means for latching and a second signal from a second node of the means for latching, the combinatorial logic circuit to enable the means for evaluating during at least a portion of an evaluation phase at least in part in response to the first and second signal from the means for latching.

14. The apparatus of claim 13, wherein the means for evaluating communicates data input information to the means for latching during at least a portion of the evaluation phase.

15. The apparatus of claim 14, wherein the combinatorial logic circuit and the means for latching are coupled to a clock signal.

16. The apparatus of claim 15, wherein the means for latching is adapted to output a data output signal.

17. The apparatus of claim 16, wherein the combinatorial logic circuit is adapted to enable the means for evaluating in response to an edge of the clock signal, the combinatorial logic circuit further adapted to disable the means for evaluating in response to a deassertion of one of the first and second signals.

18. The apparatus of claim 17, wherein the combinatorial logic circuit is adapted to enable the means for evaluating by asserting an enable signal to the means for evaluation.

19. A system, comprising:
a first execution unit;
a second execution unit; and
a flip-flop circuit coupled to an output of the first execution unit and further coupled to an input of the second execution unit, wherein the flip-flop circuit comprises:
a latching circuit;
an evaluation path circuit coupled to the latching circuit; and
a combinatorial logic circuit adapted to receive a first signal from a first node of the latching circuit and a second signal from a second node of the latching circuit, wherein the combinatorial logic circuit is coupled to the evaluation path circuit, the combinatorial logic circuit to enable the evaluation path circuit during at least a portion of an evaluation phase at least in part in response to the first and second signals from the latching circuit.

20. The system of claim 19, wherein the evaluation path circuit is adapted to communicate data input information to the latching circuit during at least a portion of the evaluation phase.

21. The system of claim 20, wherein the combinatorial logic circuit and the latching circuit are coupled to a clock signal.

22. The system of claim 21, wherein the evaluation path circuit is adapted to receive a data input signal.

23. The system of claim 22, wherein the latching circuit is adapted to output a data output signal.

24. The system of claim 23, wherein the combinatorial logic circuit is adapted to enable the evaluation path circuit in response to an edge of the clock signal, wherein the combinatorial logic circuit is further adapted to disable the evaluation path circuit in response to a deassertion of at least one of the first and second signals from the latching circuit.

25. The system of claim 24, wherein the combinatorial logic circuit is adapted to enable the evaluation path circuit by asserting an enable signal to the evaluation path circuit, the assertion of the enable signal to enable a switching device to allow current to flow through the evaluation path circuit.

26. The system of claim 7, wherein the evaluation path circuit is further adapted to receive a scan enable signal and a scan input signal.

* * * * *